United States Patent [19]

Trelewicz

[11] Patent Number: 4,584,538

[45] Date of Patent: Apr. 22, 1986

[54] MODULUS CONTROL LOOP

[75] Inventor: Eric Trelewicz, Mesa, Ariz.

[73] Assignee: Motorola, Inc., Schaumburg, Ill.

[21] Appl. No.: 625,492

[22] Filed: Jun. 28, 1984

[51] Int. Cl.[4] .............................................. H03L 7/00
[52] U.S. Cl. .................................... 331/1 A; 328/14;
331/18; 331/25; 331/173
[58] Field of Search ................. 328/14, 155; 331/1 A,
331/18, 25, 173

[56] References Cited

U.S. PATENT DOCUMENTS 4,316,151  2/1982  Ooms .................................... 331/1 A
4,344,045  8/1982  Das et al. ............................. 331/1 A Primary Examiner—Eugene R. LaRoche
Assistant Examiner—James C. Lee
Attorney, Agent, or Firm—Raymond J. Warren

[57]  ABSTRACT

An apparatus and method is disclosed for operating a modulus control loop of an LSI a phase locked loop integrated circuit (or descrete equivalent) and a dual modulus prescaler at higher frequencies. This is accomplished through the use of a flip flop whose input is the modulus control output from the synthesizer IC and whose clock input is provided by the output of the prescaler. This greatly extends the time available to shift the prescaler modulus control insuring that the control signals will not be missed and increasing the available frequencies that the modulus control loop may operate at.

13 Claims, 2 Drawing Figures

MODULUS CONTROL LOOP

BACKGROUND OF THE INVENTION

1. Field of the Invention

This invention relates, in general, to a modulus control loop and, more particularly, to a modulus control loop for controlling a phase locked loop.

2. Description of the Background

In the background art a modulus control loop is coupled from the modulus control output of the counter control logic of a phase locked loop (PLL) to the control input of a dual modulus prescaler. At higher frequencies the time to input a clock signal input the PLL from the prescaler is less than the time required to transmit the control signal back to the prescaler. When this occurs the PLL can completely miss an entire count. This problem is remedied by either reducing the input clock frequency, thru increasing the prescaler divider and corresponding reduction in reference frequency, or by reducing the frequency of the clock signal prior to receipt by the prescaler. Unfortunately, these remedies either add significant complexity to the circuit; reduce the output frequency resolution; or reduce the reference frequency.

SUMMARY OF THE INVENTION

Accordingly, it is an object of the present invention to provide a modulus control loop allowing higher operating frequencies.

A further object of the present invention is to provide an apparatus and method that will expand the selection of usable 2 modulus prescalers.

Still another object of the present invention is to provide an apparatus and method that will reduce the support parts required for a phase locked loop synthesizer integrated circuit (IC).

Yet another object of the present invention is to provide an apparatus and method of operating a phase locked loop synthesizer chip at higher frequencies.

Accordingly a first aspect of the present invention provides a modulus control loop having an input, a reference input and an output. A prescaler is provided having first and second inputs and an output. The first input of the prescaler is connected to the input of the modulus control loop to receive the input signal. A phase locked loop is also provided having first and second inputs and first and second outputs. The first input of the PLL is connected to receive an input signal from the output of the prescaler. The second input of the PLL is coupled to receive a reference signal from the reference input of the modulus control loop. The first output of the PLL is coupled to provide the output of the modulus control loop. A delay altering means is also provided for delaying a mode selection signal being transmitted from the PLL to the prescaler. The delay altering means has first and second inputs and an output. The first input is coupled to receive a clock signal from the output of the prescaler. The second input is coupled to receive the modulus control signal from the second output of the PLL. The output of the delay altering means is coupled to provide a modulus control input signal to the second input of the prescaler.

A further aspect of the present invention is to provide a modulus control loop having a method of: first, providing a signal to a prescaler; second, selecting one of a first or second variable of the prescaler; third, transmitting a signal from the prescaler to a phase locked loop and to a delay altering means; fourth, providing a reference signal to the PLL; fifth, transmitting a mode selection signal from the PLL to the delay altering means; and finally selecting one of the first or second variables of the perscaler.

DETAILED DESCRIPTION OF THE INVENTION

Figure 1:
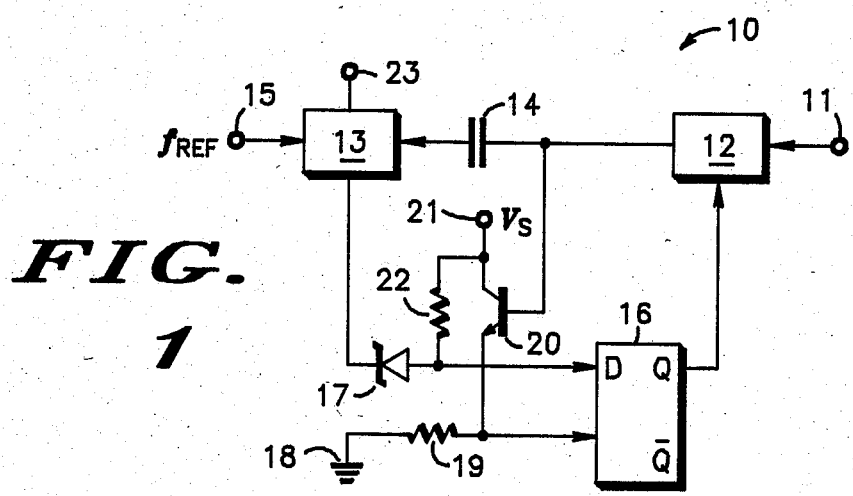
FIG. 1 is a block diagram of a modulus control loop embodying the present invention.

Referring now to FIG. 1 a block diagram of a modulus control loop, generally designated 10, embodying the present invention is illustrated. Modulus control loop 10 has a node 11 coupled to receive a clock input of a prescaler 12 (e.g. an SP8716 manufactured by Plessey). Prescaler 12 counts up to either 40 (or 41), depending on the mode selected, and will output a signal pulse for every 40 (41) input pulses. The output of prescaler 12 is coupled to the clock input of a PLL synthesizer IC 13 (e.g. a MC145156, manufactured by Motorola, Inc.) through a capacitor 14. PLL 13 controls the count of prescaler 12 by a modulus control output which is transmitted to a flip-flop 16. PLL 13 is coupled to a node 15 to receive a reference signal having a frequency, $f_{ref}$, and to an output node 23. The modulus control output of PLL 13 is coupled to the input of a D-type flip-flop 16 through a diode 17. Diode 17 provides a level translation from PLL 13, which is a CMOS circuit operating at 8 V, to flip-flop 16, which is a TTL circuit operating at 5 V. The clock input of flip-flop 16 is coupled to a ground node 18 through a resistor 19 and to the emitter of a transistor 20. The collector of transistor 20 is coupled to a supply voltage at a node 21 and to the input of flip-flop 16 through a resistor 22. The base of transistor 20 is coupled to the output of prescaler 12. Transistor 20 provides level translation from the CMOS output of prescaler 12 to the 5 V TTL logic input of flip-flop 16. The output of flip-flop 16 is coupled to the mode selection input of prescaler 12.

The output frequency of circuit 10 is represented by the equation:

$$f_o = (NP + A)f_{ref} \qquad (1)$$

where N and A are preset register values of PLL 13 and P is the preset value in prescaler 12 (P and P+1) which in this example is 40. These variables are restricted in that $N \geq A$ and $A < P$. In addition, it is required that A, N and P be nonnegative integers. Excluding the effects of time delays and looking at ideal conditions the N and A counters of PLL 13 will operate to have prescaler 12 count 40 when A=0 and 41 when A does not equal 0. Each pulse that is output from prescaler 12 reduces the number in registers N and A of PLL 13 until N reaches 0. This causes N and A to be reset to their original values. This is illustrated in the table below taking N as 5 and A as 3.

TABLE 1

| N | A | P/P + 1 |
|---|---|---|
| 5 | 3 | 41 |
| 4 | 2 | 41 |
| 3 | 1 | 41 |
| 2 | 0 | 40 |

TABLE 1-continued

| N | A | P/P + 1 |
|---|---|---------|
| 1 | 0 | 40 |
| 0 | 0 | 40 |
| 5 | 3 | 41 |

The problem which arises is that the delays in the modulus control loop at higher frequencies will be larger than the pulse time of the output of prescaler 12. This causes the prescaler to be reset on an old signal. As an example, without the additional circuitry, the modulus control output of PLL 13 would be coupled directly to the mode selection input of prescaler 12. The time delay for this circuit would be the sum of the propagation delay, $T_p$, through PLL 13 (80.5 ns for an MC 145156) plus the propagation delay, $T_p$, through prescaler 12 (30 ns for an SP 8716) plus the set up time, $T_s$, of prescaler 12 (12 ns). This has a total time requirement of 122.5 ns. If a signal having a frequency of approximately 11 MHz (440 MHz at the input of prescaler 12) were used the time period of the signal would be approximately 91 ns. As the period of the signal is less than the delay period of the modulus control loop the circuit will be resetting in the middle of the subsequent time period which will cause the prescaler to change between the second and third time periods. However, by this time, it may be desired to shift the prescaler back to the original sequence. Under certain conditions this causes the circuit to completely miss a sequence.

In the present invention this problem is resolved for frequencies in the 11 MHz range. Referring to FIG. 1, the inner loop, which clocks flip-flop 16, is comprised of prescaler 12, transistor 20 and flip-slop 16. The time delay for the inner loop is the propagation delays of all three circuits plus the set up delay for prescaler 12, which, as illustrated below, is 54 ns; that is,

| Transistor 20 propagation delay | 5 ns |
|---|---|
| Prescaler 12 propagation delay | 30 ns |
| Flip-flop 16 propagation delay | 7 ns |
| Prescaler 12 set up time | 12 ns |
| Inner Loop Delay | 54 ns |

The second part of the present invention, the outer loop, is the input of flip-flop 16. The outer loop includes PLL 13, transistor 20 and flip-flop 16. The delay of the outer loop is the propagation delay of PLL 13 and the set up time of flip-flop 16 which is 83.5ns; that is

| PLL 13 propagation delay | 80.5 ns |
|---|---|
| Flip-flop 16 set up time | 3.0 ns |
| Outer Loop Delay | 83.5 ns |

This invention operates in a look-ahead carry back scheme which puts the prescaler one cycle behind the ideal illustrated in Table 1, above. This is shown in the table below.

TABLE 2

| N | A | P/P + 1 |
|---|---|---------|
| 5 | 3 | 40* |
| 4 | 2 | 41 |
| 3 | 1 | 41 |
| 2 | 0 | 41* |
| 1 | 0 | 40 |
| 0 | 0 | 40 |

TABLE 2-continued

| N | A | P/P + 1 |
|---|---|---------|
| 5 | 3 | 40* |

The asterisks illustrate the positions that differ between the two tables. However, by comparing the two tables, it is evident that the same prescaler counting scheme is followed, (e.g. three 41 counts followed by three 40 counts).

The addition of flip-flop 16, and related circuitry, effectively extends the time available for the modulus control signal from PLL 13 to reach prescaler 12. This insures that none of the cycles will be skipped due to the time delays inherent in the circuitry in the 11 MHz range.

The first modulus control signal from PLL 13 will reach flip-flop 16 subsequent to the clock signal reaching flip-flop 16 from prescaler 12 since the propagation delay of PLL 13 is greater than the propagation delay of transistor 20. The second clock pulse to reach flip-flop 16 will arrive one signal pulse later and arrive prior to the second modulus control signal from PLL 13. This will clock flip-flop 16 causing the first modulus control signal to be transmitted to prescaler 12. The second modulus control signal will arrive one signal pulse after the first modulus control signal but after the second clock signal. After the initial clock and modulus control signals reach flip-flop 16 the subsequent signals will each be spaced by the length of the input signal which will insure that the clock pulse will always trigger flip-flop 16 to transmit the preceding modulus control signal. While prescaler 12 will operate one step behind the ideal, as illustrated in Table 2 above, it will follow that proper counting scheme.

Figure 2:
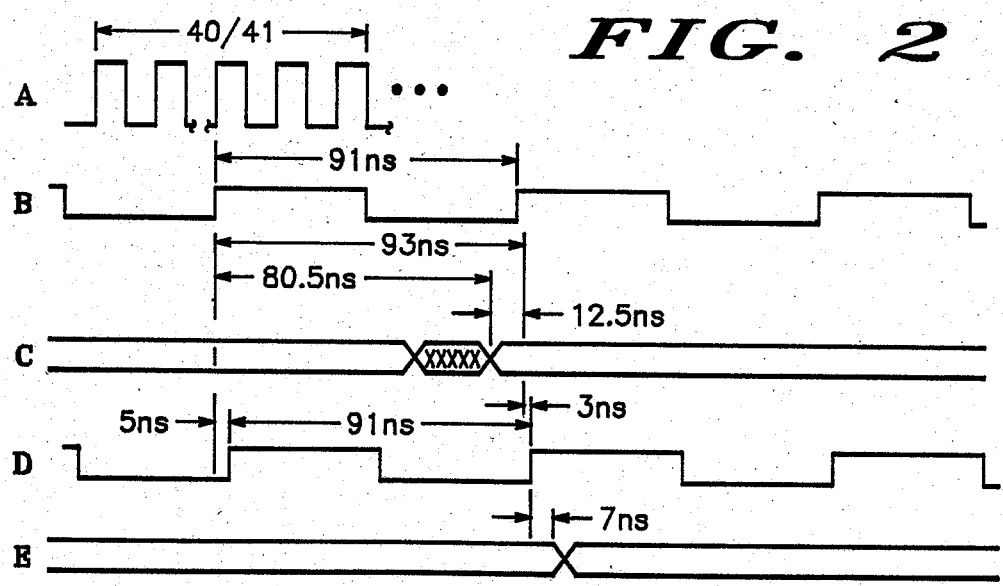
FIG. 2 is a timing diagram of the modulus control loop of FIG. 1.

Referring now to FIG. 2, a timing diagram of the circuit of FIG. 1 is illustrated. Line A illustrates the input from node 11 to prescaler 12. Line B illustrates the output of prescaler 12 which has a period of approximately 91 ns. The pulse from prescaler 12 is input to the clock input of PLL 13 and to the clock input of flip-flop 16. Line C illustrates the modulus control output of PLL 13 that is transmitted to the input of flip-flop 16. The crossed area represents the time when PLL 13's output may change with the worst case being 80.5 ns. The total time the PLL 13 output has to reach the input of flip-flop 16 is 93 ns which is the pulse time, 91 ns, plus the delay time through transistor 20, 5 ns, minus the set up time of flip-flop 16, 3 ns (91 ns+5 ns−3 ns=93 ns). Line D represents the signal at the clock input of flip-flop 16. This pulse is 91 ns in width but is delayed 5 ns through transistor 20. Line E represents the output of flip-flop 16 (input to prescaler 12). This is delayed 7 ns from the input signal, which is the propagation delay of flip-flop 16. FIG. 2 illustrates that the input to prescaler 12 will be delayed one cycle as illustrated in Table 2, infra.

Thus, it is apparent that there has been provided, in accordance with the invention, an apparatus and method that fully satisfies the objects, aims and advantages set forth above.

It has been illustrated that the present invention provides a PLL that will operate at higher frequencies than previously available without the use of additional circuitry to reduce the frequency of the input signal.

While the invention has been described in conjunction with specific embodiments thereof, it is evident that many alterations, modifications, and variations will be apparent to those skilled in the art in light of the foregoing description. Accordingly, it is intended to embrace all such alternatives, modifications, and variations as fall within the spirit and broad scope of the appended claims.

I claim:

1. A modulus control loop having a first input, a reference input and an output, said modulus control loop comprising:
   a prescaler having a first input, a second input and an output, said first input being coupled to said first input of said modulus control loop;
   a phase locked loop having a first input, a second input, a first output and a second output, said first input being coupled to said output of said prescaler, said second input being coupled to said reference input of said modulus control loop and said first output being coupled to said output of said modulus control loop; and
   delay altering means for delaying a mode selection of said prescaler, said delay altering means having a first input, a second input and an output, said first input being coupled to said output of said prescaler, said second input being coupled to said second output of said phase locked loop and said output being coupled to said second input of said prescaler.

2. The modulus control loop of claim 1 wherein said delay altering means comprises a flip-flop having an input, a clock input and an output, said clock input being coupled to said output of said prescaler, said input being coupled to said second output of said phase locked loop and said output being coupled to said second input of said prescaler.

3. The modulus control loop of claim 1 wherein the said delay altering means further comprises a transistor having a base, an emitter and a collector, said base being coupled to said first input of said delay altering means, said collector being adapted to be coupled to a supply voltage and said collector being coupled to said second input of said delay altering means.

4. The modulus control loop of claim 3 wherein said flip-flop is a D-type flip-flop.

5. The modulus control loop of claim 1 wherein the said delay altering means comprises:
   a transistor having a base, an emitter and a collector, said base being coupled to said first input of said delay altering means, said collector being adapted to be coupled to a supply voltage; and
   a flip-flop having an input, a clock input and an output, said input being coupled to said second input of said delay altering means, said clock input being coupled to said emitter of said transistor and said output being coupled to said output of said delay altering means.

6. The modulus control loop of claim 5 wherein said flip-flop comprises a D-type flip-flop.

7. A method of altering the delay time of a phase locked loop comprising the steps of:
   providing a signal to a prescaler;
   selecting one of a first and a second variable of said prescaler;
   transmitting a signal from said prescaler to a phase locked loop into a delay altering means;
   providing a reference signal to said phase locked loop;
   transmitting a mode selection signal from said phase locked loop to said delay altering means; and
   repeating said steps of selecting one of a first and a second variable of said prescaler, transmitting a signal from said prescaler, providing a reference signal to said phase locked loop, and transmitting a mode selection signal, until said signal provided to said prescaler is processed.

8. The method of claim 7 wherein said delay altering means comprises a flip-flop.

9. The method of claim 8 wherein said flip-flop comprises a D-type flip-flop.

10. The method of claim 8 wherein said delay altering means further comprises a transistor being coupled to provide said signal from said prescaler to said flip-flop.

11. The method of claim 10 wherein said flip-flop comprises a D-type flip-flop.

12. A modulus control loop having a first input, a reference input and an output, said modulus control loop comprising:
    a prescaler having a first input, a second input and an output, said first input being coupled to said first input of said modulus control loop;
    a capacitor having a first terminal and a second terminal, said second terminal being coupled to said output of said prescaler;
    a phase locked loop having a first input, a second input, a first output and a second output, said first input being coupled to said first terminal of said capacitor, said second input being coupled to said reference input of said modulus control loop and said first output being coupled to said output of said modulus control loop;
    a diode having an input and an output, said input being coupled to said second output of said phase locked loop;
    a transistor having a collector, an emitter and a base, said base being coupled to said output of said prescaler and said collector being coupled to an input voltage;
    a first resistor having a first terminal and a second terminal, said first terminal being coupled to said output of said diode and said second terminal being coupled to said collector of said transistor;
    a second resistor having a first terminal and a second terminal, said first terminal being coupled to said emitter of said transistor and said second terminal being coupled to a ground; and
    a flip-flop having an input, a clock input and an output, said input being coupled to said output of said diode, said clock input being coupled to said emitter of said transistance and said output being coupled to said second input of said prescaler.

13. The modulus control loop of claim 12 wherein said flip-flop comprises a D-type flip-flop.

* * * * *